United States Patent [19]

Sanders

[11] 3,997,349

[45] Dec. 14, 1976

[54] LIGHT-SENSITIVE DEVELOPMENT-FREE DRIOGRAPHIC PRINTING PLATE

[75] Inventor: James F. Sanders, Hudson, Wis.

[73] Assignee: Minnesota Mining and Manufacturing Company, St. Paul, Minn.

[22] Filed: June 17, 1974

[21] Appl. No.: 479,653

[52] U.S. Cl. .............................. 96/75; 96/33.85; 96/86 R; 96/86 P; 96/87 R; 96/115 R; 252/184; 260/142

[51] Int. Cl.² ...................... G03C 1/54; G03C 1/94

[58] Field of Search ............ 96/75, 91 R, 85, 86 R, 96/87 R, 86 P, 115 P, 115 R, 33; 252/184; 260/47 EC, 142

[56] References Cited

UNITED STATES PATENTS

| | | | |
|---|---|---|---|
| 3,113,023 | 12/1963 | Mellan | 96/75 X |
| 3,211,553 | 10/1965 | Ito | 96/75 |
| 3,235,382 | 2/1966 | Neugebauer et al. | 96/75 |
| 3,294,743 | 12/1966 | Mack | 260/47 |
| 3,300,309 | 1/1967 | Chu | 96/75 |
| 3,396,019 | 8/1968 | Uhlig | 96/75 X |
| 3,511,178 | 5/1970 | Curtin | 96/75 X |
| 3,606,922 | 9/1971 | Doggett | 96/75 |
| 3,632,375 | 1/1972 | Gipe | 96/75 |
| 3,677,178 | 7/1972 | Gipe | 96/75 |
| 3,679,419 | 7/1972 | Gillich | 96/75 |
| 3,703,496 | 11/1972 | Hodan et al. | 260/47 EC |
| 3,704,311 | 11/1972 | Koshar | 252/184 |
| 3,708,296 | 1/1973 | Schlesinger | 96/75 X |
| 3,711,390 | 1/1973 | Feinberg | 96/75 X |
| 3,779,768 | 12/1973 | Cope et al. | 96/75 |
| 3,790,382 | 2/1974 | Dahlman | 96/75 |
| 3,790,385 | 2/1974 | Steppan et al. | 96/75 |
| 3,790,556 | 2/1974 | Doggett | 96/75 |
| 3,847,614 | 11/1974 | Mattor | 96/75 |
| 3,910,187 | 10/1975 | Cords | 96/33 |

OTHER PUBLICATIONS

Kirk—Othmar, "Ency. of Chem. Tech.", vol. 1, 2nd Ed., 1963, pp. 1–11.

*Primary Examiner*—Charles L. Bowers, Jr.
*Attorney, Agent, or Firm*—Alexander, Sell, Steldt & DeLaHunt

[57] ABSTRACT

Light-sensitive article comprising a substrate coated with a light-sensitive composition comprising a diazonium salt formed from an aromatic diaxonium compound and an adhesive acid or salt thereof. The article can be utilized as a driographic printing plate upon imagewise exposure to actinic radiation without necessity of a liquid development step.

8 Claims, No Drawings

LIGHT-SENSITIVE DEVELOPMENT-FREE DRIOGRAPHIC PRINTING PLATE

BACKGROUND OF THE INVENTION

This invention relates to waterless planographic printing. More particularly it relates to novel photosensitive sheet constructions suitable for use in waterless planographic printing which do not require liquid development.

In planographic printing, as the name implies, both image and nonimage areas lie substantially in the same plane, i.e. the ink-receptive image areas are not substantially raised from the surface of the printing plate. The nonimage areas are made ink-repellent so that upon ink application to the plate surface, only image areas accept the ink for subsequent transfer to a sheet material.

Conventional lithography, the best known form of planography, generally requires a dampening of the printing plate with an aqueous fountain solution to effectively wet the nonimage plate areas after which ink is rolled over the plate. The oily ink selectively wets the oleophilic image areas but is repelled from the dampened nonimage areas.

To overcome difficulties inherent with conventional lithography, planographic printing plates not requiring dampening have recently been developed. These plates require only an inking system to be operative, and inherently contain ink repellent nonimage areas. This relatively new concept has come to be known by the term driography, and plates useful therein have been termed driographic plates. Such a printing plate is disclosed in U.S. Pat. No. 3,511,178.

Driographic plates generally operate on the principle that the nonimage or background surface areas have sufficiently low adhesion to driographic printing inks that ink applied to the plate by an inking roller will not split away or transfer from the roller to the plate in such areas. A surface exhibiting such characteristics has been termed "adhesive". An analysis of driographic printing processes and ink requirements therefor is presented in *Pira's Process Product Survey, Driography*, Surry England (1972).

At present, one of the most common techniques for providing ink-receptive imagewise areas on driographic plates is by selective removal of the adhesive coating. For example, in the aforementioned U.S. Pat. No. 3,511,178, a material which is adhesive, e.g. a curable silicone elastomer, is coated over a light-sensitive diazo resin layer on a suitable substrate. Liquid development of the imaged plate removes the unexposed diazo resin and silicone elastomer overcoat in an imagewise fashion. Another imaging technique is to overcoat an adhesive material with an ink-receptive composition which can be selectively removed in an imagewise fashion in unexposed areas with a liquid developer. In this instance it is extremely difficult to obtain a satisfactory bond between the adhesive material and the exposed overlayer.

In the aforementioned driographic concepts a development step is necessary to provide a press-ready plate. This step adds a time delay and introduces additional processing equipment and supplies in the production of a driographic plate. Additionally, skill and training is required for plate preparation.

SUMMARY OF THE INVENTION

In contrast to prior art techniques, my invention provides a light-sensitive sheet construction requiring only imagewise exposure to provide a press-ready driographic printing plate. The development step, with its attendant time consumption, equipment, and supplies is unnecessary. Additionally, only a single coating layer is necessary, thereby avoiding the successive overlays of the aforementioned driographic techniques.

In accordance with the invention there is provided a light-sensitive article comprising a substrate having on at least one surface thereof a layer of a light-sensitive composition comprising the salt formed from an aromatic diazonium compound and an adhesive acid or salt thereof.

The article can be conveniently utilized as a driographic printing plate upon imagewise exposure to actinic radiation without necessity of liquid development.

By appropriate processing techniques, either a negative-acting plate, i.e. wherein exposed areas accept ink while unexposed do not, or a positive-acting plate, i.e. wherein unexposed areas accept ink while exposed areas do not, can be prepared.

DETAILED DESCRIPTION OF THE INVENTION

Adhesive materials are those chemical species which, when coated on a suitable substrate, have sufficiently low adhesion for driograhic printing inks such that ink will not transfer to them when utilized in conventional lithographic presses with the dampening system removed. Generally, chemical species having low surface free energies function well as abhesive materials. Examples of such species include perfluoroaliphatic compounds, polydimethylsiloxanes and, to a lesser degree, aliphatic hydrocarbons.

Conversely, adhesive materials, as used in this context, have sufficiently high adhesion for driographic printing inks such that ink will transfer thereto under conditions described above.

The abhesive properties of a surface can be defined in terms of its effectiveness as a release agent. This effectiveness can be conveniently measured by a recognized test, wherein a piece of adhesive tape is applied to the surface and the force required to strip the tape from the surface is measured. The test parameters and details are as disclosed in aforementioned U.S. Pat. No. 3,511,178, such disclosure herein incorporated by reference. As pointed out therein, materials with release values up to about 100 grams per inch have utility as adhesive materials, while those having a value in excess of 100 are generally unsatisfactory.

The aromatic diazonium nuclei useful in my invention may be represented by the general formula:

wherein $N_2$ is the diazonium group ($-N \equiv N^+$) and Ar represents those aromatic moieties known in the art as useful in forming stable light-sensitive diazonium compounds. Such moieties are well-known and recognized in the art, as for example shown by Kosar, *Light-Sensitive Systems*, John Wiley and Sons, Inc., New York, New York (1965), at pages 202–214, and by Glafkides, *Photographic Chemistry*, Vol. II, Fountain Press, London, England (1960), at pages 709–725. By stability is meant that the compound is stable under subdued light.

To this art-recognized class of stable aromatic diazonium nuclei is added a moiety derived from an abhesive acid or salt thereof, i.e. an acid or salt which displays adhesive characteristics, containing an anion capable of maintaining the stability of the diazonium nuclei by formation of an ionic or covalent bond therewith. The compounds useful in my invention can thus be represented by the formula:

$$Ar\ N_2^+\ Ab^-$$

wherein $Ab^-$ is an anion derived from an abhesive acid or salt thereof.

Examples of anionic abhesive moieties include perfluoroaliphatic compounds containing at least three carbon atoms attached to the anion, for example:

$C_nF_{2n+1}SO_3^-$ where $n = 4$, 6 or 8,
$C_nF_{2n+1}CO_3^-$ where $n = 3$, 5, 7 or 9, and
$(C_nF_{2n+1}SO_2)_2\ CR^-$ where $n = 4$, 6 or 8 and $R =$ hydrogen, a lower alkyl group, i.e. no more than about 4 carbon atoms, a halogen atom, e.g. —Br and —Cl, or can in fact be another $C_nF_{2n+1}SO_2$ group.

Other exemplary materials include aliphatic hydrocarbons attached to the anion, e.g. $CH_3(CH_2)_{11}OSO_3^-$, and polydimethylsiloxanes.

The preferred light-sensitive compound for use in my invention is

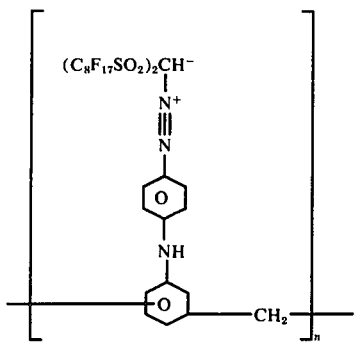

wherein $n$ is about 5.

Preparation of the light-sensitive diazonium salt useful in my invention is generally uncomplicated. Diazonium compounds, which are commercially available, generally contain stabilizing anions such as chlorides or zinc chloride double salts. Adhesive acids or salts thereof are known in the art; for example the preferred fluorochemical acid is described in U.S. Pat. No. 3,704,311. The stabilizing anions of the diazo compounds can be replaced by the anions from the abhesive acids or salts thereof by a simple precipitation technique, such as is hereinafter described in the illustrative examples.

The anionic moiety, of course, must be one which is sufficiently polar to couple with the aromatic diazonium nucleus and provide a compound which is stable under subdued light. Generally, strong acids of their salts provide excellent anions to effectuate this result.

The light-sensitive diazonium salt can be conveniently coated onto a substrate by conventional methods such as dip coating, pour coating, knife or gravure coating, etc. In the preferred embodiment of my invention, the light struck portions of the coating will accept driographic ink while the unexposed background areas will be adhesive, i.e. repel ink. This is commonly termed a negative-acting plate. It has been found that if coating application solvents are utilized which have a relatively low degree of solubility for the diazonium salt, the anionic adhesive moiety of the diazonium salt will apparently orient itself toward the coating surface, thereby affording excellent adhesive characteristics to the dry coating surface. Lower alcohols such as methyl alcohol, isopropyl alcohol, n-propyl alcohol, etc. are examples of solvents having a relatively low degree of solubility for the diazonium salt which will provide a highly abhesive dry coating surface.

Minor amounts of solvents having a relatively high degree of solubility for the diazonium salt can be utilized to facilitate providing a uniform coating solution. Such solvents include lower ketones such as acetone, methyl ethyl ketone, methyl isobutyl ketone, etc.

While not desiring to be limited by theory, it would appear that upon exposure of the light-sensitive diazonium salt to actinic radiation, the diazonium bond between the anionic adhesive moiety and the aromatic moiety is broken. There is probably some nitrogen gas produced, along with complex organic matter and free adhesive acid. While there may be a minor amount of chemical coupling between the free adhesive acid and the ring structure of the aromatic moiety, the major effect of exposure is to change the composition from a hard crystalline solid with a high melting point to a two-phase material containing a low molecular weight abhesive component overlying a hard decomposition product or organic cap of the aromatic diazonium nuclei.

This hard decomposition product or organic cap from the aromatic diazonium nuclei is adhesive, i.e. ink receptive. The free abhesive acid thought to be formed in accordance with this exposure mechanism overlies the ink receptive organic cap and can be easily displaced by driographic ink upon inking of the surface.

The dry coating weight of the light-sensitive diazonium salt should be sufficient to provide a continuous coating film on the substrate. Generally about 5 milligrams per square foot is sufficient to provide a suitable continuous coating. As the dry coating weight increases, the amount of free adhesive acid formed upon light exposure of the coating correspondingly increases. This increases the difficulty in displacement of the adhesive acid by driographic ink in exposed areas. Generally coating weights as high as 20 milligrams per square foot will still allow easy displacement of the free adhesive acid on the exposed surface by driographic ink.

The substrate upon which the light-sensitive diazonium salt can be coated can be varied. Exemplary substrates include metallic foils or plates such as aluminum, copper, zinc, brass or materials clad with these metals, hard-finished cloth and glass. Other suitable supports include polyester, e.g. polyethylene terephthalate, polyamides; e.g. polyhexamethylene alipamide, polyolefins; e.g. polyethylene and polypropylene. Since the substrate surface itself is not utilized in printing, the hydrophobicity or hydrophilicity of the substrate is unimportant.

It has been found that substrates having a subbing layer, such as gelatin, can exhibit some type of interaction with the light-sensitive salt upon light exposure. The substrate appears to have some development or acid accepting capability in exposed areas such that inking of light exposed areas readily occurs even at high dry coating weights, e.g. about 100 milligrams per square foot or even higher. In other words, even though a large amount of free adhesive acid may be formed upon exposure, it apparently migrates to the subbing layer such that a printing ink can readily wet the light exposed areas. One subbing layer exhibiting such characteristics is gelatin.

Film forming polymeric binders can be included in the light-sensitive coating composition. Typical polymeric binders include polyurethanes, epoxy resins and polyvinylpyrrolidinone. Weight ratios of organic binder to light-sensitive material of from about 1:10 to about 3:1 have been found useful. It has been discovered that inclusion of polymeric binders with the light-sensitive diazonium salt often provides some interaction between the binder resin and the light-sensitive salt in light exposed areas such that these areas will accept ink readily, even at dry coating weights of 100 milligrams per square foot. This is espeicially true with binders containing highly polar groups, such as polyvinylpyrrolidinone.

Having now described my invention, the same will be more specifically described with the aid of the following nonlimiting examples, wherein all parts are by weight unless otherwise specified.

EXAMPLE I

A light-sensitive diazonium salt is prepared as follows.

4.8 grams of bis (perfluorooctylsulfonyl) methane, a fluorochemical acid displaying adhesive characteristics, is added to 20 ml of acetone. This mixture is then agitated to produce a suspension of the adhesive fluorochemical acid. To this suspension is added 20 ml of water and 5 ml of 4 percent by weight sodium hydroxide in water. This mixture is then heated at 50° C. until a clear solution results, after approximately 30 minutes. The mixture is then cooled, after which 180 ml of water are added and the solution placed in an ice bath.

A second solution is made by placing 1.5 grams of Andrews Diazo A, tradename for a diazo resin which is believed to be the polymerization product or paradiazo diphenylamine zinc chloride double salt with formaldehyde, in 200 ml of water, this solution also being cooled in an ice bath. The first solution is fitted with a high shear mixing blade and motor. The diazo solution is then added dropwise to the fluorochemical acid solution over a period of approximately 20 minutes while maintaining a high rate of mixing. A finely divided precipitate is formed upon addition of the diazo solution. Mixing is continued for approximately one-half hour after addition of all of the diazo solution. The precipitate is then filtered and washed several times with water. The wet filtrate cake is then frozen to separate the water from the light-sensitive diazonium salt. The frozen cake is then placed on filter paper and the ice allowed to melt. Water will no longer wet the light-sensitive material and is simply absorbed by the filter paper leaving behind a dry yellow powder. This powder is the salt of the aromatic diazonium compound and the adhesive fluorochemical acid.

0.2 grams of the yellow powder is added to 5 ml of acetone followed by mixing. When a complete solution is attained, after approximately 30 seconds, 195 ml of methyl alcohol is added. This solution is then poured in the pan of a small laboratory dip-coating apparatus. Untreated polyester film is then coated and dried at a temperature of 60° C. in an oven placed in line with the coater, to provide a dry coating weight of about 10 mg per square foot. The surface has a release value of less than 50 grams per inch when measured as per the test described in U.S. Pat. No. 3,511,178.

A 10 × 15 inch sample of the film is exposed through a photographic negative transparency in a conventional vacuum frame at a distance of 40 inches from a 50 amp carbon arc for a period of 20 seconds. The exposed film is then placed on a Multilith 1250 Printing Press with the conventional dampening system removed. The plate was found to accept driographic ink only in the light exposed areas, and 400 good quality copies were prepared therefrom.

EXAMPLE II

Utilizing the procedure for preparing the light-sensitive salt as described in Example 1, 1.5 grams of paradiazo diphenyl amine chloride is precipitated with 2.7 grams of perfluorooctyl sulfonic acid. After isolation of the dry powder, a solution is made containing 0.4 grams of the salt in 10 ml of methyl ethyl ketone. Isopropyl alcohol is added to the solution to bring the total volume to 200 ml. The rough side of a matte-finished polyester drafting film is then coated according to the technique described in Example 1, whereupon a coating surface having a release value of less than 50 grams per inch is obtained. A sample of the coated drafting film is exposed through a transparency in accordance with the method of Example 1 and inked manually with a rubber roller having a thin coating on the surface thereof of Consolidated Printing Ink Co. "Kwik Lith Ink" on its outer surface. Ink deposits only in the exposed areas, with the adhesive background or unexposed areas repelling the ink.

EXAMPLE III

Using the procedure described in Example I, 1.5 grams of the polymerization product of paradiazo diphenyl amine zinc chloride double salt and formaldehyde (as taught in U.S. Pat. No. 2,714,066) is precipitated with 2.2 grams of perfluorooctanoic acid. A solution is made of 0.6 grams of this material and 10 ml of acetone and the solution volume made up to 200 ml with anhydrous ethyl alcohol.

The solution is pour coated over a linen rag, dried manually with a heat gun, exposed through a photographic transparency as per Example I, and inked manually using the technique described in Example II. Ink was found to deposit only in the light exposed areas of the cloth.

The solution is coated onto the corona primed polyethylene surface of a paper base and dried to provide a dry coating weight of about 10 mg per square foot and a release value of less than 50 grams per inch. Upon exposure through a transparency as in Example I, the plate was press tested utilizng the press of Example I, whereupon 150 good quality copies were produced. The driographic ink was deposited only in the light exposed portions of the plate.

EXAMPLE IV

A solution of 2.4 grams of perfluorobutane sulfonic acid sodium salt in 200 ml of water was added dropwise to 200 ml of the solution of the diazo resin described in Example III. A finely divided yellow precipitate was formed which was collected by filtration. After drying for several hours in air, 0.2 grams of the powder is dissolved in 200 ml of methyl alcohol. To the alcohol solution is also added 0.2 grams of polyvinyl pyrrolidinone. This coating solution is then used in the laboratory coated described in Example I to provide a dry coating weight on untreated polyester film of 20 mg per square foot and a release value of less than 50 grams per inch. A sample of the coated film is exposed and press tested utilizing the press of Example I, whereupon 150 good quality copies are produced. The driographic ink is deposited only in the exposed areas of the printing plate.

EXAMPLE V

One gram of the diazo salt described in Example I is dissolved in 10 ml of methyl ethyl ketone and brought to a total solution volume of 200 ml with ethyl alcohol. This solution is pour coated on a gelatin-coated polyester film and dried manually with a heat gun to provide a dry coating weight of about 100 mg per square foot. The coated film is exposed through a transparency and inked manually with an inking roller. Driographic ink is found to deposit only on the exposed areas of the film.

EXAMPLE VI

Five grams of $CH_3(CH_2)_{11}OSO_3Na$ (dodecyl sodium sulfate) is dissolved in 200 ml of water. A second solution is made by dissolving 4 grams of the diazo compound of Example I in 200 ml of water. The diazo solution is added to the first solution as per the method outlined in Example I, whereupon a precipitate is formed and collected. The precipitate is dissolved in methyl alcohol to provide an 0.2 weight percent solution which is then pour coated on an untreated surface of a polyester film and air dried to provide a dry coating weight of 20 mg per square foot. When manually inked as per Example V, driographic ink was found to deposit only on the exposed areas of the plate.

Surprisingly, it has been discovered that the light-sensitive diazonium salt, when appropriately coated on a substrate, can also operate as a positive-acting system, i.e. wherein driographic ink will deposit only on the unexposed areas of the plate and will be repelled by the exposed areas thereof.

As aforementioned, when coating application solvents having a relatively low degree of solubility for the light sensitive diazonium salt are utilized the dry coating surface exhibits excellent abhesive characteristics, apparently due to orientation of the anionic abhesive moiety at the coating surface. Conversely, where a major amount of solvents are utilized which have a high degree of solubility for the diazonium salt, this abhesive surface characteristic is not present, and the coating surface will in fact accept driographic ink. As aforementioned, lower ketones are examples of such solvents.

When this surface is exposed to light, free abhesive acid is thought to be formed on the surface in accordance with the exposure mechanism hereinbefore discussed. If a sufficient amount of this free abhesive acid is formed, the driographic ink has a difficult time displacing the abhesive acid. Until the acid is displaced, the unexposed portions of the plate will accept driographic ink and the exposed portions will repel it, i.e. the plate is positive-acting.

Dry coating weights in excess of about 20 milligrams per square foot, and more preferrably in the 100 milligram per square foot or higher range, will generally provide an exposed image area which is adhesive.

EXAMPLE VII

One gram of the diazo salt described in Example I is dissolved in 100 ml of methyl ethyl ketone and brought to a total solution volume of 200 ml with toluene. This solution is pour coated over a hand held sheet of polyester and dried manually with a conventional heat gun to provide a dry coating weight of about 100 mg per square foot. The coated film is exposed through a transparency and placed on the printing press of Example I. The plate was found to accept ink only in the unexposed areas, and 50 good quality copies were made.

Besides providing driographic printing plates, the diazonium salt can be applied to substratres such as glass, metal, cloth, etc., imaged and inked, to provide a decorative overlay thereon.

What is claimed is:

1. A light-sensitive article comprising a substrate having a light-sensitive continuous coating on a surface thereof, said coating consisting essentially of a diazonium salt formed from an aromatic diazonium compound and an abhesive perfluoroaliphatic acid or salt thereof, said acid containing at least three carbon atoms, said coating being capable of providing adhesive areas and abhesive areas merely upon exposure of said coating to an imagewise pattern of actinic radiation without further treatment thereof the dry coating weight of said coating being sufficient to provide free abhesive acid in only exposed areas which can be displaced by driographic ink whereby said ink deposits in only exposed areas in a negative acting driographic system or said dry coating weight being sufficient to provide so much free abhesive acid in only exposed areas that driographic ink is repelled whereby said ink deposits in only unexposed areas in a positive acting driographic system.

2. The article of claim 1 wherein the anionic portion of said diazonium salt is represented by the formula:

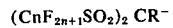

$(C_nF_{2n+1}SO_2)_2 CR^-$ wherein $n$ is 4, 6 or 8 and R is selected from the group consisting of a hydrogen atom, a halogen atom, a lower alkyl group, or $C_nF_{2n+1}SO_2$.

3. The article of claim 1 wherein said substrate is polyester film.

4. The article of claim 1 wherein said diazonium salt has the formula:

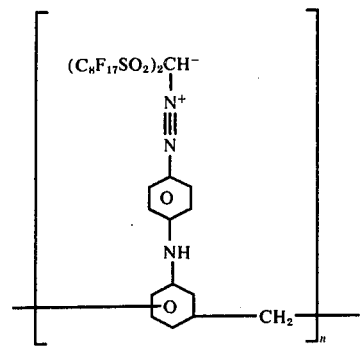

wherein $n$ is about 5.

5. The article of claim 1 wherein said substrate is glass.

6. The article of claim 1 wherein said substrate is cloth.

7. The article of claim 1 wherein said substrate is metal.

8. A light-sensitive negative acting driographic article comprising a substrate having a gelatin coating on a surface thereof, and overlying said gelatin continuous coating a light-sensitive coating, said light-sensitive coating consisting essentially of a diazonium salt formed from an aromatic diazonium compound and an abhesive perfluoroaliphatic acid or salt thereof, said acid containing at least three carbon atoms, said light-sensitive coating being capable upon exposure to actinic radiation by an imagewise pattern of providing abhesive areas in unexposed areas, and adhesive areas in exposed areas, whereby driographic ink deposits in only said exposed areas.

* * * * *

UNITED STATES PATENT AND TRADEMARK OFFICE
CERTIFICATE OF CORRECTION

PATENT NO. : 3,997,349
DATED : December 14, 1976
INVENTOR(S) : James F. Sanders

Page 1 of 2

It is certified that error appears in the above-identified patent and that said Letters Patent are hereby corrected as shown below:

Col. 1, line 48, "adhesive" should read -- abhesive --.
Col. 1, line 50, "adhesive" should read -- abhesive --.
Col. 1, line 57, "adhesive" should read -- abhesive --.
Col. 2, line 15, "adhesive" should read -- abhesive --.
Col. 2, line 29, "adhesive" should read -- abhesive --.
Col. 2, line 53, "adhesive" should read -- abhesive --.
Col. 3, line 6, "adhesive" should read -- abhesive --.
Col. 3, line 52, "adhesive" should read -- abhesive --.
Col. 4, line 7, "adhesive" should read -- abhesive --.
Col. 4, line 9, "adhesive" should read -- abhesive --.
Col. 4, line 23, "adhesive" should read -- abhesive --.
Col. 4, line 26, "adhesive" should read -- abhesive --.
Col. 4, line 27, "adhesive" should read -- abhesive --.
Col. 4, line 46, "adhesive" should read -- abhesive --.
Col. 4, line 49, "adhesive" should read -- abhesive --.
Col. 4, line 52, "adhesive" should read -- abhesive --.
Col. 5, line 5, "adhesive" should read -- abhesive --.
Col. 5, line 33, "adhesive" should read -- abhesive --.
Col. 5, line 35, "adhesive" should read -- abhesive --.
Col. 6, line 35, "adhesive" should read -- abhesive --.
Col. 8, line    "adhesive" should read -- abhesive --.

UNITED STATES PATENT OFFICE
CERTIFICATE OF CORRECTION

Patent No. 3,997,349  Dated December 14, 1976

Inventor(s) James F. Sanders  Page 2 of 2

It is certified that error appears in the above-identified patent and that said Letters Patent are hereby corrected as shown below:

Column 9, lines 9 and 10, should read -- said gelatin continuous coating a light-sensitive continuous coating, --.

Signed and Sealed this

Thirty-first Day of May 1977

[SEAL]

Attest:

RUTH C. MASON  
*Attesting Officer*

C. MARSHALL DANN  
*Commissioner of Patents and Trademarks*